United States Patent
Liu et al.

(10) Patent No.: US 12,057,520 B2
(45) Date of Patent: Aug. 6, 2024

(54) DISPLAY SUBSTRATE, MANUFACTURING METHOD THEREOF, AND DISPLAY DEVICE

(71) Applicant: BOE TECHNOLOGY GROUP CO., LTD., Beijing (CN)

(72) Inventors: Yingwei Liu, Beijing (CN); Zhiwei Liang, Beijing (CN); Ke Wang, Beijing (CN); Zhanfeng Cao, Beijing (CN); Shuang Liang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 964 days.

(21) Appl. No.: 16/918,753

(22) Filed: Jul. 1, 2020

(65) Prior Publication Data

US 2021/0066538 A1 Mar. 4, 2021

(30) Foreign Application Priority Data

Aug. 27, 2019 (CN) .......................... 201910795512.4

(51) Int. Cl.
*H01L 33/00* (2010.01)
*H01L 27/15* (2006.01)
*H01L 33/48* (2010.01)
*H01L 33/56* (2010.01)

(52) U.S. Cl.
CPC ........ *H01L 33/0093* (2020.05); *H01L 27/156* (2013.01); *H01L 33/486* (2013.01); *H01L 33/56* (2013.01); *H01L 2933/005* (2013.01)

(58) Field of Classification Search
CPC .......................... H01L 33/0093; H01L 27/124
See application file for complete search history.

(56) References Cited

U.S. PATENT DOCUMENTS

| | | | |
|---|---|---|---|
| 2005/0016768 A1* | 1/2005 | Zollo | H05K 3/4623 |
| | | | 174/262 |
| 2018/0124923 A1* | 5/2018 | Meng | H05K 3/18 |
| 2020/0212370 A1 | 7/2020 | Ye | |
| 2022/0102458 A1* | 3/2022 | Kim | H10K 71/00 |

FOREIGN PATENT DOCUMENTS

| | | |
|---|---|---|
| CN | 1830083 A | 9/2006 |
| CN | 109671858 A | 4/2019 |

OTHER PUBLICATIONS

First Office Action for Chinese Application No. 201910795512.4, dated Apr. 6, 2021, 5 Pages.

* cited by examiner

*Primary Examiner* — Kenneth Parker
*Assistant Examiner* — Christopher A Culbert
(74) *Attorney, Agent, or Firm* — Brooks Kushman P.C.

(57) ABSTRACT

A method for manufacturing a display substrate includes: fabricating a first functional structure on a first side of a common substrate, and fabricating a second functional structure on a second side of the common substrate; fabricating a via hole in an edge region of the common substrate; and fabricating a conductive connection portion in the via hole, a first end of the conductive connection portion on the first side extending out of the via hole and coupled to a first functional pattern in the first functional structure, and a second end of the conductive connection portion on the second side extending out of the via hole and coupled to a second functional pattern in the second functional structure. The method provided in embodiments of the present disclosure is applied to the manufacturing of a display substrate.

7 Claims, 4 Drawing Sheets

DISPLAY SUBSTRATE, MANUFACTURING METHOD THEREOF, AND DISPLAY DEVICE

CROSS-REFERENCE TO RELATED APPLICATION

This application claims priority to Chinese Patent Application No. 201910795512.4 filed on Aug. 27, 2019, which is incorporated herein by reference in its entirety.

TECHNICAL FIELD

The present disclosure relates to the field of display technology, and in particular to a display substrate, a manufacturing method thereof, and a display device.

BACKGROUND

Through glass via (TGV) technology is a technology in which a via hole is fabricated in a glass substrate and filled with a conductive metal material so that the metal material in the via hole connects a functional structure on an upper surface of the glass substrate to a functional structure on a lower surface of the glass substrate.

In related art, when the above-mentioned TGV technology is applied to a backplane of a display product, the manufacturing process of the backplane generally includes: fabricating a via hole in the substrate and filling the via hole with a conductive metal material, and then fabricating corresponding functional structures on upper and lower surfaces of the substrate. During the fabrication of the functional structures, a through hole is formed to correspond to the via hole in the substrate and a conductive material is filled in the through hole, so that the conductive material can be electrically connected to the metal material so as to enable a functional pattern in the functional structure on the upper surface to be electrically connected to a functional pattern in the functional structure on the lower surface.

However, when the corresponding structures are fabricated on the upper and lower surfaces of the substrate, the metal material filled in the via hole is easily disconnected from the conductive material in the through hole, thereby disconnecting the coupling between the functional patterns on the upper and lower surfaces of the substrate and thus reducing a production yield of the backplane.

SUMMARY

In a first aspect, an embodiment of the present disclosure provides a method for manufacturing a display substrate, including: fabricating a first functional structure on a first side of a common substrate and fabricating a second functional structure on a second side of the common substrate, the first side being opposite to the second side; fabricating, in an edge region of the common substrate, a via hole which penetrates the common substrate, the first functional structure and the second functional structure; and fabricating a conductive connection portion in the via hole, a first end of the conductive connection portion on the first side extending out of the via hole and coupled to a first functional pattern in the first functional structure, and a second end of the conductive connection portion on the second side extending out of the via hole and coupled to a second functional pattern in the second functional structure.

According to some optional embodiments of the present disclosure, fabricating the first functional structure on the first side of the common substrate and fabricating the second functional structure on the second side of the common substrate includes: coating an organic material on a first glass substrate to form a first organic substrate; fabricating the first functional structure on a side of the first organic substrate facing away from the first glass substrate; separating the first glass substrate from the first organic substrate; coating an organic material on a second glass substrate to form a second organic substrate; fabricating the second functional structure on a side of the second organic substrate facing away from the second glass substrate; separating the second glass substrate from the second organic substrate; and bonding a surface of the first organic substrate facing away from the first functional structure to a surface of the second organic substrate facing away from the second functional structure, the first organic substrate and the second organic substrate constituting the common substrate.

According to some optional embodiments of the present disclosure, bonding the first organic substrate to the second organic substrate includes: bonding the surface of the first organic substrate facing away from the first functional structure to the surface of the second organic substrate facing away from the second functional structure using a prepreg made of a resin; and curing the prepreg.

According to some optional embodiments of the present disclosure, fabricating the via hole includes: irradiating a via hole region in the edge region where the via hole is to be fabricated with a laser, to burn the first functional structure, the first organic substrate, the cured prepreg, the second organic substrate and the second functional structure in the via hole region to form the via hole.

According to some optional embodiments of the present disclosure, fabricating the first functional structure includes: fabricating, on the first side of the common substrate, a thin film transistor array layer which includes a plurality of sub-pixel drive circuits, each including a drive transistor; and fabricating a first signal line and a set of pads for binding one or more light emitting devices on a side of the thin film transistor array layer facing away from the common substrate, wherein the first signal line is configured to be coupled to an end of the conductive connection portion on the first side; the set of pads is in one-to-one correspondence with the sub-pixel drive circuits, and the set of pads includes a first pad coupled to an output electrode of the drive transistor in the corresponding sub-pixel drive circuits, and a second pad coupled to a cathode of a power supply in the display substrate.

According to some optional embodiments of the present disclosure, fabricating the second functional structure includes: forming a first signal line lead and an alignment mark on the second side of the common substrate; fabricating an insulating layer covering the alignment mark and a part of the first signal line lead, wherein a part of the first signal line lead not covered by the insulating layer is configured to be coupled to an end of the conductive connection portion on the second side; and fabricating, on a side of the insulating layer facing away from the common substrate, a binding pin which is coupled to the first signal line lead through a through hole provided in the insulating layer.

According to some optional embodiments of the present disclosure, the first signal line lead and the alignment mark are simultaneously fabricated by one single patterning process on the second side of the common substrate.

According to some optional embodiments of the present disclosure, the method further includes binding one or more micro light-emitting diodes on the set of pads after the conductive connection portion has been fabricated.

In a second aspect, an embodiment of the present disclosure further provides a display substrate including: a common substrate; a first functional structure provided on a first side of the common substrate; a second functional structure provided on a second side of the common substrate, the first side being opposite to the second side; a via hole, provided in an edge region of the common substrate and penetrating the common substrate, the first functional structure, and the second functional structure; and a conductive connection portion provided in the via hole, wherein a first end of the conductive connection portion on the first side extends out of the via hole and is coupled to a first functional pattern in the first functional structure, and a second end of the conductive connection portion on the second side extends out of the via hole and is coupled to a second functional pattern in the second functional structure.

According to some optional embodiments of the present disclosure, the common substrate includes a first organic substrate and a second organic substrate which are stacked and bonded.

According to some optional embodiments of the present disclosure, the first organic substrate and the second organic substrate are bonded by a prepreg made of a resin.

According to some optional embodiments of the present disclosure, the first functional structure includes: a thin film transistor array layer, located on the first side of the common substrate and including a plurality of sub-pixel drive circuits, each including a drive transistor; and a first signal line and a set of pads, located on a side of the thin film transistor array layer facing away from the common substrate, wherein the first signal line is configured to be coupled to an end of the conductive connection portion on the first side; the set of pads is in one-to-one correspondence with the sub-pixel drive circuits, and the set of pads includes a first pad coupled to an output electrode of the drive transistor in the corresponding sub-pixel drive circuit, and a second pad coupled to a cathode of a power supply in the display substrate.

According to some optional embodiments of the present disclosure, the second functional structure includes: a first signal line lead and an alignment mark provided on the second side of the common substrate; an insulating layer covering the alignment mark and a part of the first signal line lead, wherein a part of the first signal line lead not covered by the insulating layer is configured to be coupled to an end of the conductive connection portion on the second side; and a binding pin, provided on a side of the insulating layer facing away from the common substrate and coupled to the first signal line lead through a through hole provided in the insulating layer.

According to some optional embodiments of the present disclosure, the first signal line lead and the alignment mark are provided in a same layer and made of a same material.

According to some optional embodiments of the present disclosure, the display substrate further includes: a plurality of micro light-emitting diodes, which is bound to the set of pads in one-to-one correspondence.

According to some optional embodiments of the present disclosure, the conductive connection portion is made of a metal conductive material.

According to some optional embodiments of the present disclosure, the metal conductive material includes silver adhesive or copper adhesive.

According to some optional embodiments of the present disclosure, the micro light-emitting diode includes a Mini-light-emitting diode (LED) chip or a Micro-LED chip.

In a third aspect, an embodiment of the present disclosure further provides a display device including a plurality of the display substrates which are spliced together.

According to some optional embodiments of the present disclosure, the display device is an LED display device.

BRIEF DESCRIPTION OF THE DRAWINGS

The drawings described herein are used to provide a further understanding of the embodiments of the present disclosure, and constitute a part of the present disclosure. The exemplary embodiments of the present disclosure and description thereof are used to explain the embodiments of the present disclosure, and do not constitute improper limitations to the embodiments of the present disclosure limited. In the drawings.

DETAILED DESCRIPTION

In order to further illustrate a display substrate, a manufacturing method thereof, and a display device provided by the embodiments of the present disclosure, they will be described hereinafter in detail with reference to the accompanying drawings of the specification.

In view of the problems in the Background, the inventors of the present disclosure have found through research that when fabricating corresponding functional structures on upper and lower surfaces of a substrate, high-temperature annealing, high-temperature film deposition or other processes will be performed, and due to a difference in thermal expansion coefficient between a metal material filled in the via hole and a substrate material, during these processes, it is easy to cause the metal material filled in the via hole to expand, protruding out of an edge of the via hole of the substrate, which results in a disconnection between the metal material near the edge and the conductive material in the through hole, thus disconnecting the coupling between a functional pattern on the upper surface and a functional pattern on the lower surface of the substrate, and consequently reducing the production yield of the backplane.

Based on the above findings, the inventors of the present disclosure found through further research that, by fabricating functional structures on upper and lower surfaces of a substrate provided first, then forming a via hole which can penetrating the functional structures on the upper and lower surfaces and the substrate after the fabrication of the functional structures is completed, and forming, in the via hole, a conductive connection portion for electrically connecting the functional pattern on the upper surface and the functional pattern on the lower surface of the substrate, it is possible to better prevent the conductive connection portion from being disconnected during the process of fabricating the functional structures on the upper and lower surfaces and thus well ensure the production yield of the backplane.

Figure 3:
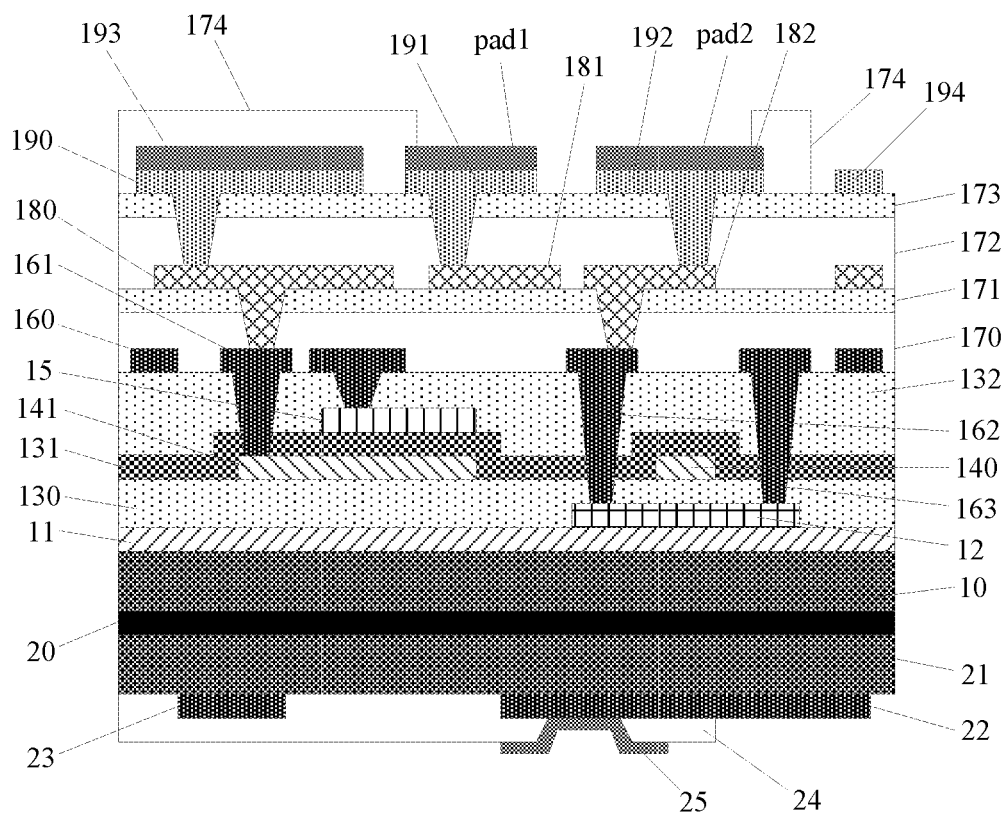
FIG. 3 is a schematic diagram of bonding the first organic substrate and the second organic substrate according to an embodiment of the present disclosure.
Figure 4:
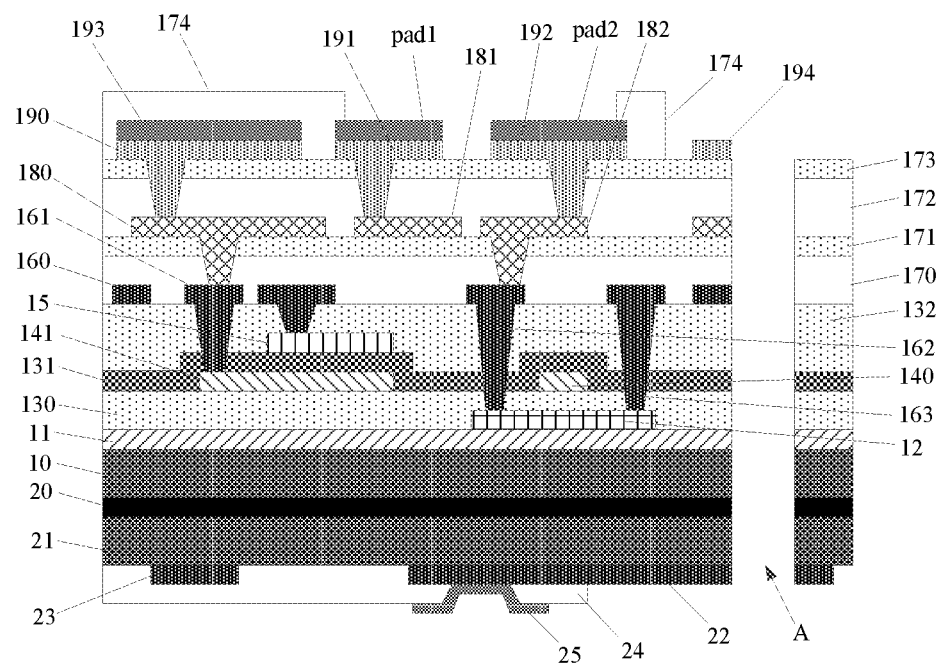
FIG. 4 is a schematic diagram of fabricating a via hole provided by an embodiment of the present disclosure.
Figure 5:
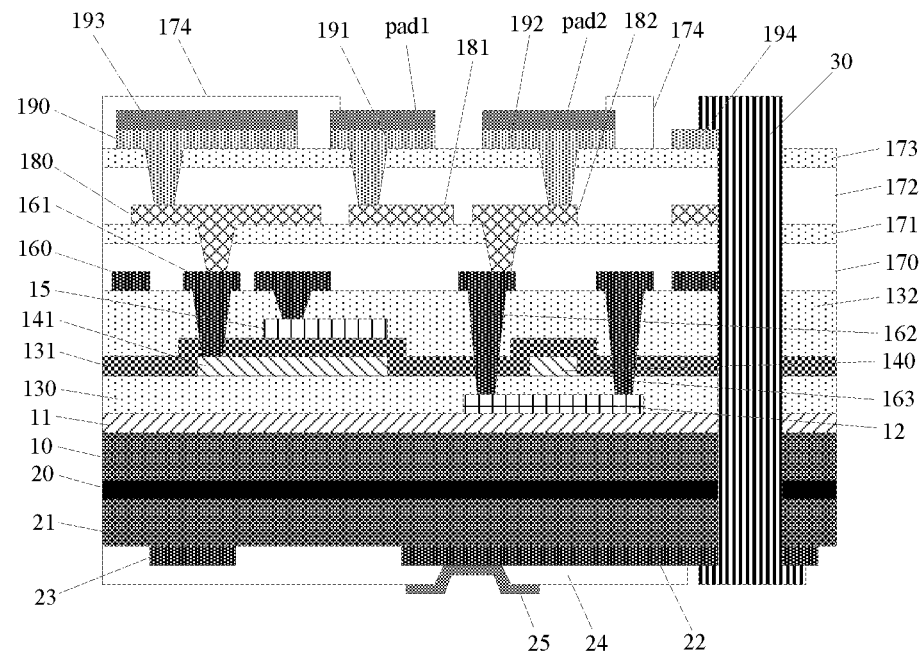
FIG. 5 is a schematic diagram of fabricating a conductive connection portion in the via hole provided by an embodiment of the present disclosure.

Please refer to FIGS. 3 to 5 for details. An embodiment of the present disclosure provides a method for manufacturing a display substrate, including:

fabricating a first functional structure on a first side of a common substrate and fabricating a second functional structure on a second side of the common substrate, the first side being opposite to the second side, as shown in FIG. 3;

fabricating, in an edge region of the common substrate, a via hole A which penetrates the common substrate, the first functional structure and the second functional structure, as shown in FIG. 4; and fabricating a conductive connection portion 30 in the via hole, a first end of the conductive connection portion 30 on the first side extending out of the via hole A and coupled to a first functional pattern 194 in the first functional structure, and a second end of the conductive connection portion 30 on the second side extending out of the via hole A and coupled to a second functional pattern 22 in the second functional structure, as shown in FIG. 5.

Specifically, the first functional structure may be fabricated on the first side of the common substrate first, and may have various specific structures. For example, it includes a drive circuit layer and a light emitting element located on a side of the drive circuit layer facing away from the substrate. Then, the second functional structure may be fabricated on the second side of the common substrate, and may have various specific structures. The second functional structure mainly functions to couple the second functional pattern 22 included in the second functional structure to the first functional pattern 194 in the first functional structure through the conductive connection portion 30, so as to extend the first functional pattern 194 to the second side of the common substrate. In this way, it is possible to achieve that a signal is provided to the first function pattern 194 by the second function pattern 22, or that a signal transmitted by the first function pattern 194 is received by the second function pattern 22.

After the first functional structure and the second functional structure have been fabricated on the common substrate, that is, after all processes such as high-temperature annealing or high-temperature film deposition required to fabricate the first functional structure and the second functional structure are completed, a via hole A is made in an edge region of the functional substrate, such that the via hole A can penetrate the common substrate, the first functional structure and the second functional structure, and the first functional pattern 194 in the first functional structure is located near a port of the via hole A on the first side of the substrate, and the second functional pattern 22 in the second functional structure is located near another port of the via hole A on the second side of the substrate. In this way, a first end of the conductive connection portion 30 can be coupled to the first functional pattern 194, and a second end of the conductive connection portion 30 can be coupled to the second functional pattern 22.

A material of the conductive connection portion 30 can be selected according to actual needs, and exemplarily, a metal conductive material may be used to form the conductive connection portion 30. In particular, silver adhesive or copper adhesive may be used to form the conductive connection portion 30.

In the method for manufacturing the display substrate provided in the embodiment of the present disclosure, the first functional structure is fabricated on the first side of the common substrate, and the second functional structure is fabricated on the second side of the common substrate, and the via hole A is then fabricated in the edge region of the common substrate to penetrate the first functional structure, the common substrate and the second functional structure, and thereafter, the conductive connection portion 30 is fabricated in the via hole A to couple the first functional pattern 194 included in the first functional structure to the second functional pattern 22 included in the second functional structure. Thus, in the manufacturing method provided in the embodiment of the present disclosure, both the via hole A and the conductive connection portion 30 in the via hole A are formed after the first functional structure and the second functional structure have been fabricated, and will not be subjected to the high-temperature processes in the manufacturing process of the first functional structure and the second functional structure. Therefore, when applying the display substrate manufactured by the manufacturing method provided in the embodiment of the present disclosure to a backplane of a display product, the conductive connection portion 30 can well couple the functional pattern on the first side of the common substrate to the functional pattern on the second side of the functional substrate, thereby better improving the production yield and reliability of the backplane.

In addition, in the display substrate manufactured by the manufacturing method provided in the above embodiment, a partial functional structure (i.e., the second functional structure) located in a non-display region of the display substrate can be moved to the second side of the common substrate, and the second functional pattern 22 in the partial functional structure is enabled to be electrically connected to the first functional pattern 194 on the first side of the common substrate through the conductive connection portion 30, thereby reducing a frame width of the display substrate and thus contributing to frame narrowing of a display product when the display substrate is applied to display product.

It is to be noted that the specific structure and material of the common substrate can be selected according to actual needs. Exemplarily, a glass substrate may be used as the common substrate. Of course, a substrate made of an organic material may be used as the common substrate. When the substrate made of the organic material is used as the common substrate, the steps of fabricating the first functional structure on the first side of the common substrate and fabricating the second functional structure on the second side of the common substrate specifically include the following steps.

Figure 1A:
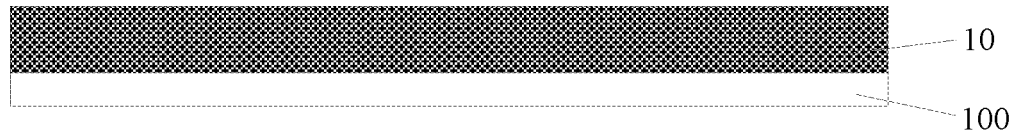
FIGS. 1A-1C are schematic flowcharts of fabricating a first functional structure on a first organic substrate provided by an embodiment of the present disclosure.

As shown in FIG. 1A, an organic material is coated on a first glass substrate 100 to form a first organic substrate 10.

Figure 1B:
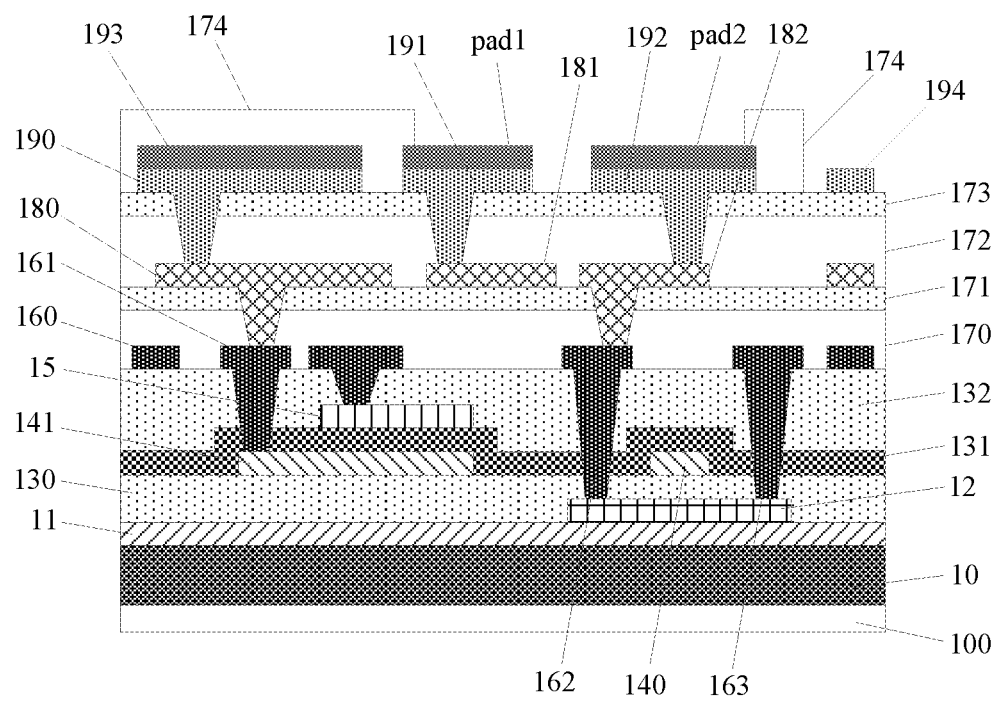

As shown in FIG. 1B, the first functional structure is fabricated on a side of the first organic substrate 10 facing away from the first glass substrate 100.

Figure 1C:
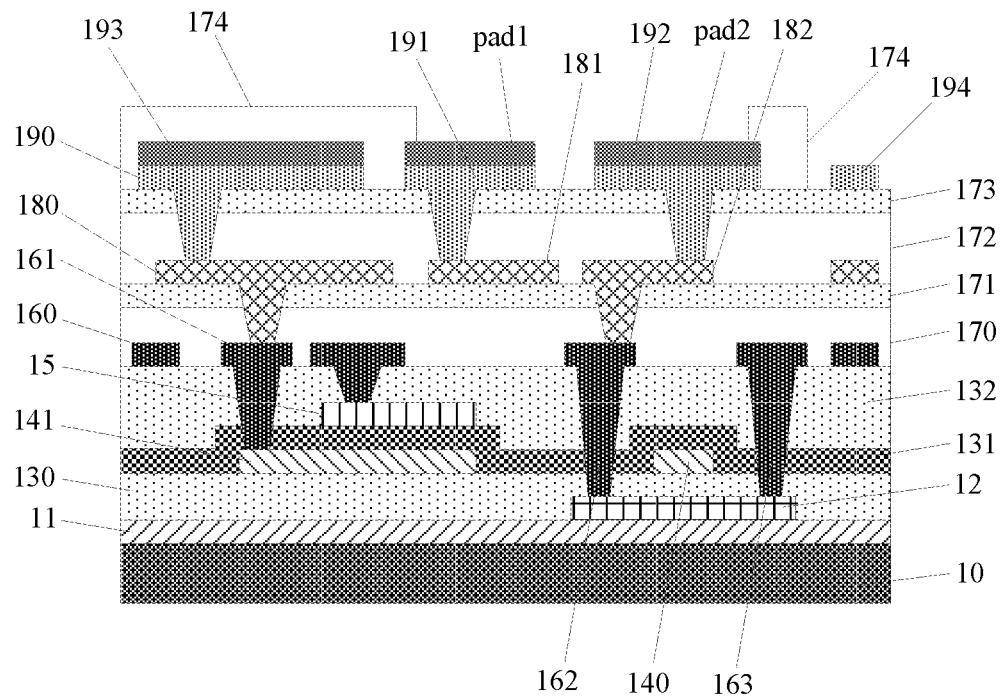

As shown in FIG. 1C, the first glass substrate 100 is separated from the first organic substrate 10.

Figure 2A:
FIGS. 2A-2C are schematic flowcharts of fabricating a second functional structure on a second organic substrate provided by an embodiment of the present disclosure.

As shown in FIG. 2A, an organic material is coated on a second glass substrate 200 to form a second organic substrate 21.

Figure 2B:
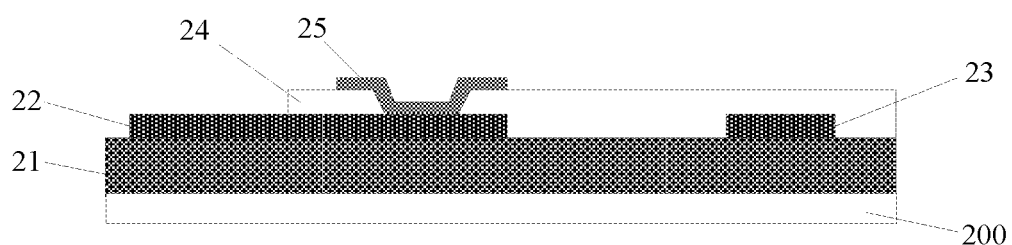

As shown in FIG. 2B, the second functional structure is fabricated on a side of the second organic substrate 21 facing away from the second glass substrate 200.

Figure 2C:
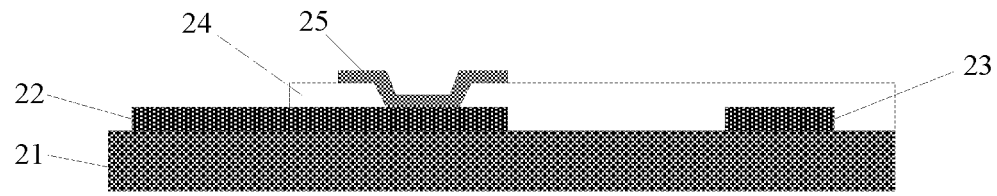

As shown in FIG. 2C, the second glass substrate 200 is separated from the second organic substrate 21.

Furthermore, as shown in FIG. 3, a surface of the first organic substrate 10 facing away from the first functional structure is bonded to a surface of the second organic substrate 21 facing away from the second functional structure, and the first organic substrate 10 and the second organic substrate 21 constitute the common substrate.

Specifically, there are various organic materials that can be coated on the first glass substrate. Exemplarily, a polyimide material may be used.

When coating the organic material on the first glass substrate to form the first organic substrate 10, a thickness of the first organic substrate 10 can be set according to actual needs. After the first organic substrate 10 has been fabricated, the first functional structure may be fabricated on a side of the first organic substrate 10 facing away from the first glass substrate. After the fabrication of the first functional structure is completed, a laser peeling-off technique may be used to peel off the first glass substrate from the first organic substrate 10.

In the process of fabricating the first organic substrate 10 and the first functional structure, an organic material may be simultaneously coated on the second glass substrate to form the second organic substrate 21. Similarly, a thickness of the second organic substrate 21 can also be set according to actual needs. After the second organic substrate 21 has been fabricated, the second functional structure is fabricated on a side of the second organic substrate 21 facing away from the second glass substrate. After the fabrication of the second functional structure is completed, the laser peeling-off technique may also be used to peel off the second glass substrate from the second organic substrate 21.

After the first glass substrate is peeled off from the first organic substrate 10, and after the second glass substrate is peeled off from the second organic substrate 21, a surface of the first organic substrate 10 facing away from the first functional structure may be bonded to a surface of the second organic substrate 21 facing away from the second functional structure, so that the first organic substrate 10 and the second organic substrate 21 constitute the common substrate, the first functional structure is located on the first side of the common substrate, and the second functional structure is located on the second side of the common substrate.

It can be seen that when the manufacturing method provided in the above embodiment is used to form the common substrate, the first functional structure on the first side of the common substrate and the second functional structure on the second side of the common substrate, the first glass substrate and the second glass substrate can be provided simultaneously, and the processes of fabricating the first organic substrate 10 and the first functional structure on the first glass substrate and fabricating the second organic substrate 21 and the second functional structure on the second glass substrate can be simultaneously performed. Moreover, after the laser peeling-off operation is completed, a surface of the first organic substrate 10 facing away from the first functional structure is directly bonded to a surface of the second organic substrate 21 facing away from the second functional structure, that is, the step of fabricating the first functional structure and the second functional structure on the common substrate is completed. Therefore, when the manufacturing method provided in the above embodiment is used to form the common substrate, the first functional structure on the first side of the common substrate, and the second functional structure on the second side of the common substrate, the first functional structure on the first side of the common substrate and the second functional structure on the second side of the common substrate can be manufactured at the same time, which effectively improves the manufacturing efficiency of the display substrate and reduces the production cost of the display substrate.

In addition, when the common substrate is manufactured by the manufacturing method provided in the above embodiment, the common substrate is composed of the first organic substrate 10 and the second organic substrate 21, and is more advantageous to form the via hole A with high-precision dimensions as compared with the substrate made of glass.

As shown in FIG. 3, in some embodiments, the step of bonding the first organic substrate 10 to the second organic substrate 21 specifically includes: bonding a surface of the first organic substrate 10 facing away from the first functional structure to a surface of the second organic substrate 21 facing away from the second functional structure using a prepreg 20 made of a resin, and curing the prepreg 20.

Specifically, the first organic substrate 10 and the second organic substrate 21 may be bonded together in various ways. Exemplarily, the surface of the first organic substrate 10 facing away from the first functional structure is bonded to the surface of the second organic substrate 21 facing away from the second functional structure using the prepreg 20 made of a resin, and the prepreg is then cured, so as to achieve the firm bonding of the first organic substrate 10 and the second organic substrate 21 together.

It should be noted that the above-mentioned prepreg made of a resin is a sheet-like prepreg synthesized by the resin and a carrier, wherein the resin is a thermosetting material, which is a polymer, and it is epoxy resin that is commonly used.

In the manufacturing method provided in the above embodiment, the first organic substrate 10 and the second organic substrate 21 are bonded by using the prepreg made of the resin, so that it is more beneficial to a manufacturing accuracy of the via hole A when a laser is subsequently used to form the via hole A.

In some embodiments, the step of fabricating the via hole A specifically includes: irradiating a via hole region in the edge region where the via hole A is to be fabricated with a laser, to burn the first functional structure, the first organic substrate 10, the cured prepreg, the second organic substrate 21 and the second functional structure in the via hole region to form the via hole A.

Specifically, there are various specific methods for manufacturing the via hole A. Exemplarily, a laser may be used to irradiate the via hole region in the edge region where the via hole A is to be fabricated, to burn the first functional structure, the first organic substrate 10, the cured prepreg, the second organic substrate 21, and the second functional structure located in the via hole region so as to form the via hole A.

The use of the laser to form the via hole A can better ensure the accuracy of the fabricated via hole A.

There are various specific structures for the first functional structure and the second functional structure provided by the foregoing embodiments. Exemplarily, the steps of manufacturing the first functional structure specifically include:

fabricating, on the first side of the common substrate, a thin film transistor array layer which includes a plurality of sub-pixel drive circuits, each including a drive transistor; and fabricating a first signal line (i.e., the first functional pattern 194) and a set of pads for binding one or more light emitting devices on a side of the thin film transistor array layer facing away from the common substrate, wherein the first signal line is configured to be coupled to an end of the conductive connection portion 30 on the first side; the set of pads is in one-to-one correspondence with the sub-pixel drive circuits, and the set of pads includes a first pad coupled to an output electrode of the drive transistor in the corresponding sub-pixel drive circuits, and a second pad coupled to a cathode of a power supply in the display substrate.

The above step of fabricating the second functional structure specifically include:

fabricating a first signal line lead and an alignment mark 23 on the second side of the common substrate simultaneously through a patterning process;

fabricating an insulating layer 24 covering the alignment mark 23 and a part of the first signal line lead (i.e., the second functional pattern 22), wherein a part of the first signal line lead not covered by the insulating layer 24 is configured to be coupled to an end of the conductive connection portion 30 on the second side; and fabricating, on a side of the insulating layer 24 facing away from the common substrate, a binding pin 25 which is coupled to the first signal line lead through a through hole provided in the insulating layer 24.

Specifically, when fabricating the first functional structure, the thin film transistor array layer may be first fabricated on the first side of the common substrate, and may include a plurality of sub-pixel drive circuits located in a display region of the display substrate and distributed in an array, and each of the sub-pixel drive circuits includes a drive transistor and some transistors having a switching function. The thin film transistor array layer may further include a gate drive circuit located in a non-display region of the display substrate, and a signal transmission line located in the display region and/or the non-display region.

After the thin film transistor array layer has been fabricated, the first signal line and the set of pads for binding the one or more light emitting devices may be further fabricated on the side of the thin film transistor array layer facing away from the common substrate. The set of pads is in one-to-one correspondence with the sub-pixel drive circuits, and is configured to bind one or more light-emitting elements.

When fabricating the second functional structure, the first signal line lead and the alignment mark 23 that are independent of each other can be simultaneously fabricated on the second side of the common substrate through a single patterning process. A first portion of the first signal line lead is located at an edge of a port of the via hole A on the second side of the common substrate; and the alignment mark 23 plays an alignment role when bonding the first organic substrate 10 to the second organic substrate 21.

After the first signal line lead and the alignment mark 23 have been fabricated, an insulating layer 24 may be further fabricated on a side of the first signal line lead and the alignment mark 23 facing away from the common substrate, so that the insulating layer 24 can entirely cover the alignment mark 23 and the other portions of the first signal line lead except for the first portion. Then, the fabrication of a connection through hole in the insulating layer 24 can continue, and the connection through hole penetrates the insulating layer 24, and can expose a portion of the first signal line lead. Next, a binding pin 25 is fabricated on a side of the insulating layer 24 facing away from the common substrate, so that a portion of the binding pin 25 is located in the connection through hole and coupled to the first signal line lead which is exposed through the connection through hole, and the other portion of the binding pin 25 is located outside the connection through hole and configured to bond a chip structure that provides a signal.

In more detail, as shown in FIG. 5 showing partial structures of the first functional structure and the second functional structure, the partial structure shown in the first functional structure include:

a buffer layer 11, formed on a surface of the first organic substrate 10;

a drive transistor, formed on a side of the buffer layer 11 facing away from the first organic substrate 10 and including an active layer 12, a gate electrode 140, an input electrode 163, and an output electrode 162;

a capacitor structure, including a first electrode plate 141 and a second electrode plate 15; wherein the first electrode plate 141 is coupled to a power supply anode 180 of the display substrate through a fourth connection portion 161;

a set of pads, including a first pad pad2 and a second pad pad1; wherein the first pad pad2 is connected to the output electrode 162 of the drive transistor through a first connection portion 192 and a second connection portion 182, and the second pad pad1 is coupled to a power supply cathode 181 in the display substrate through a third connection portion 191; and an insulating film (e.g., marks 130, 131, 132), a first planarizing layer 170, a first passivation layer 171, a second planarizing layer 172, a second passivation layer 173, a third planarizing layer 174, a data line 160, etc., provided between the functional patterns; and some functional patterns with conductive properties (e.g., marks 160, 193).

It should be noted that each of the first pad pad2, the second pad pad1 and the functional pattern 193 may be made of indium tin oxide (ITO) or metallic copper, but they are not limited thereto.

In the display substrate manufactured by the manufacturing method provided in the above embodiment, the first signal line and the first signal line lead are used for transmitting a variety of signals. For example, the first signal line may be coupled to a data signal line in the display region of the display substrate, and the first signal line lead may be coupled to a chip for providing a data signal, and the data signal provided by the chip is transmitted to a corresponding data signal line through the first signal line lead and the first signal line. Of course, the first signal line and the first signal line lead may be provided for transmitting a positive power signal or a negative power signal, for example.

In some embodiments, the manufacturing method further includes: binding one or more micro light-emitting diodes on the set of pads after fabricating the conductive connection portion 30.

Specifically, the micro light-emitting diode may include a Mini-light-emitting diode (LED) chip and a Micro-LED chip, for example.

An embodiment of the present disclosure further provides a display substrate manufactured by using the manufacturing method provided in the above embodiment. The display substrate includes:

a common substrate;

a first functional structure provided on a first side of the common substrate;

a second functional structure provided on a second side of the common substrate, the first side being opposite to the second side;

a via hole A, provided in an edge region of the common substrate and penetrating the common substrate, the first functional structure, and the second functional structure; and a conductive connection portion 30 provided in the via hole A, wherein a first end of the conductive connection portion 30 on the first side extends out of the via hole A and is coupled to a first functional pattern 194 in the first functional structure, and a second end of the conductive connection portion 30 on the second side extends out of the via hole A and is coupled to a second functional pattern 22 in the second functional structure.

Specifically, the first functional structure may be fabricated on the first side of the common substrate first, and may have various specific structures. For example, it includes a drive circuit layer and a light emitting element located on a side of the drive circuit layer facing away from the substrate. Then, the second functional structure may be fabricated on the second side of the common substrate, and may have various specific structures. The second functional structure mainly functions to couple the second functional pattern 22 included in the second functional structure to the first functional pattern 194 in the first functional structure through the conductive connection portion 30, so as to extend the first functional pattern 194 to the second side of the common substrate. In this way, it is possible to achieve that a signal is provided to the first function pattern 194 by the second function pattern 22, or that a signal transmitted by the first function pattern 194 is received by the second function pattern 22.

After the first functional structure and the second functional structure have been fabricated on the common substrate, that is, after all processes such as high-temperature annealing or high-temperature film deposition required to fabricate the first functional structure and the second functional structure are completed, a via hole A is made in an edge region of the functional substrate, such that the via hole A can penetrate the common substrate, the first functional structure and the second functional structure, and the first functional pattern 194 in the first functional structure is located near a port of the via hole A on the first side of the substrate, and the second functional pattern 22 in the second functional structure is located near another port of the via hole A on the second side of the substrate. In this way, a first end of the conductive connection portion 30 can be coupled to the first functional pattern 194, and a second end of the conductive connection portion 30 can be coupled to the second functional pattern 22.

A material of the conductive connection portion 30 can be selected according to actual needs, and exemplarily, a metal conductive material may be used to form the conductive connection portion 30. In particular, silver adhesive or copper adhesive may be used to form the conductive connection portion 30.

When the display substrate provided in the embodiment of the present disclosure is manufactured using the manufacturing method provided in the forgoing embodiment, the first functional structure is fabricated on the first side of the common substrate, and the second functional structure is fabricated on the second side of the common substrate, and the via hole A is then fabricated in the edge region of the common substrate to penetrate the first functional structure, the common substrate and the second functional structure, and thereafter, the conductive connection portion 30 is fabricated in the via hole A to couple the first functional pattern 194 included in the first functional structure to the second functional pattern 22 included in the second functional structure. Thus, in the display substrate provided in the embodiment of the present disclosure, both the via hole A and the conductive connection portion 30 in the via hole A are formed after the first functional structure and the second functional structure have been fabricated, and will not be subjected to the high-temperature processes in the manufacturing process of the first functional structure and the second functional structure. Therefore, when applying the display substrate provided in the embodiment of the present disclosure to a backplane of a display product, the conductive connection portion 30 can well couple the functional pattern on the first side of the common substrate to the functional pattern on the second side of the functional substrate, thereby better improving the production yield and reliability of the backplane.

In addition, in the display substrate provided in the embodiment of the present disclosure, a partial functional structure (i.e., the second functional structure) located in a non-display region of the display substrate can be moved to the second side of the common substrate, and the second functional pattern 22 in the partial functional structure is enabled to be electrically connected to the first functional pattern 194 on the first side of the common substrate through the conductive connection portion 30, thereby reducing a frame width of the display substrate and thus contributing to frame narrowing of a display product when the display substrate is applied to display product.

In some embodiments, the common substrate includes a first organic substrate 10 and a second organic substrate 21 which are stacked thereon and bonded by a prepreg made of a resin.

Specifically, the first organic substrate 10 and the second organic substrate 21 may be made of various organic materials. For example, a polyimide material may be used.

The process of fabricating the common substrate includes: coating an organic material on the first glass substrate to form the first organic substrate 10, wherein a thickness of the first organic substrate 10 can be set according to actual needs. After the first organic substrate 10 has been fabricated, the first functional structure may be fabricated on a side of the first organic substrate 10 facing away from the first glass substrate. After the fabrication of the first functional structure is completed, a laser peeling-off technique may be used to peel off the first glass substrate from the first organic substrate 10.

In the process of fabricating the first organic substrate 10 and the first functional structure, an organic material may be simultaneously coated on the second glass substrate to form the second organic substrate 21. Similarly, a thickness of the second organic substrate 21 can also be set according to actual needs. After the second organic substrate 21 has been fabricated, the second functional structure is fabricated on a side of the second organic substrate 21 facing away from the second glass substrate. After the fabrication of the second functional structure is completed, the laser peeling-off technique may also be used to peel off the second glass substrate from the second organic substrate 21.

After the first glass substrate is peeled off from the first organic substrate 10, and after the second glass substrate is peeled off from the second organic substrate 21, a surface of the first organic substrate 10 facing away from the first functional structure may be bonded to a surface of the second organic substrate 21 facing away from the second functional structure, so that the first organic substrate 10 and the second organic substrate 21 constitute the common substrate, the first functional structure is located on the first side of the common substrate, and the second functional structure is located on the second side of the common substrate.

It can be seen that in the display substrate provided in the above embodiment, when the manufacturing method provided in the above embodiment is used to form the common substrate, the first functional structure on the first side of the common substrate and the second functional structure on the second side of the common substrate, the first glass substrate and the second glass substrate can be provided simultaneously, and the processes of fabricating the first organic substrate 10 and the first functional structure on the first glass substrate and fabricating the second organic substrate 21 and the second functional structure on the second glass substrate can be simultaneously performed. Moreover, after the laser peeling-off operation is completed, a surface of the first organic substrate 10 facing away from the first functional structure is directly bonded to a surface of the second organic substrate 21 facing away from the second functional structure, that is, the step of fabricating the first functional structure and the second functional structure on the common substrate is completed. Therefore, when the manufacturing method provided in the above embodiment is used to form the common substrate, the first functional structure on the first side of the common substrate, and the second functional structure on the second side of the common substrate, the first functional structure on the first side of the common substrate and the second functional structure on the second side of the common substrate can be manufactured at the same time, which effectively improves the manufacturing efficiency of the display substrate and reduces the production cost of the display substrate.

In addition, in the display substrate provided in the above embodiment, the common substrate is composed of the first organic substrate 10 and the second organic substrate 21, and is more advantageous to form the via hole A with high-precision dimensions as compared with the substrate made of glass.

It is to be noted that the first organic substrate 10 and the second organic substrate 21 may be bonded together in various ways. Exemplarily, the surface of the first organic substrate 10 facing away from the first functional structure is bonded to the surface of the second organic substrate 21 facing away from the second functional structure using the prepreg 20 made of a resin, and the prepreg is then cured, so as to achieve the firm bonding between the first organic substrate 10 and the second organic substrate 21 together.

In some embodiments, the first functional structure includes:

a thin film transistor array layer, located on the first side of the common substrate and including a plurality of sub-pixel drive circuits, each including a drive transistor; and a first signal line and a set of pads, located on a side of the thin film transistor array layer facing away from the common substrate, wherein the first signal line is configured to be coupled to an end of the conductive connection portion 30 on the first side; the set of pads is in one-to-one correspondence with the sub-pixel drive circuits, and the set of pads includes a first pad coupled to an output electrode of the drive transistor in the corresponding sub-pixel drive circuit, and a second pad coupled to a cathode of a power supply in the display substrate.

In some embodiments, the second functional structure includes:

a first signal line lead and an alignment mark 23 provided on the second side of the common substrate and in a same layer and made of a same material;

an insulating layer covering the alignment mark 23 and a part of the first signal line lead, wherein a part of the first signal line lead not covered by the insulating layer is configured to be coupled to an end of the conductive connection portion 30 on the second side; and a binding pin 25, provided on a side of the insulating layer facing away from the common substrate and coupled to the first signal line lead through a through hole provided in the insulating layer.

In some embodiments, the display substrate further includes a plurality of micro light-emitting diodes, which is bound to the set of pads in one-to-one correspondence. It should be noted that the micro light-emitting diode may include a Mini-LED chip and a Micro-LED chip, for example.

Specifically, when fabricating the first functional structure, the thin film transistor array layer may be first fabricated on the first side of the common substrate, and may include a plurality of sub-pixel drive circuits located in a display region of the display substrate and distributed in an array, and each of the sub-pixel drive circuits includes a drive transistor and some transistors having a switching function. The thin film transistor array layer may further include a gate drive circuit located in a non-display region of the display substrate, and a signal transmission line located in the display region and/or the non-display region.

After the thin film transistor array layer has been fabricated, the first signal line and the set of pads for binding the one or more light emitting devices may be further fabricated on the side of the thin film transistor array layer facing away from the common substrate. The set of pads is in one-to-one correspondence with the sub-pixel drive circuits, and is configured to bind one or more light-emitting elements.

When fabricating the second functional structure, the first signal line lead and the alignment mark 23 that are independent of each other can be simultaneously fabricated on the second side of the common substrate through a single patterning process. A first portion of the first signal line lead is located at an edge of a port of the via hole A on the second side of the common substrate; and the alignment mark 23 plays an alignment role when bonding the first organic substrate 10 to the second organic substrate 21.

After the first signal line lead and the alignment mark 23 have been fabricated, an insulating layer 24 may be further fabricated on a side of the first signal line lead and the alignment mark 23 facing away from the common substrate, so that the insulating layer 24 can entirely cover the alignment mark 23 and the other portions of the first signal line lead than the first portion. Then, the fabrication of a connection through hole in the insulating layer 24 can continue, and the connection through hole penetrates the insulating layer 24, and can expose a portion of the first signal line lead. Next, a binding pin 25 is fabricated on a side of the insulating layer 24 facing away from the common substrate, so that a portion of the binding pin 25 is located in the connection through hole and coupled to the first signal line lead which is exposed through the connection through hole, and the other portion of the binding pin 25 is located outside the connection through hole and configured to bond a chip structure that provides a signal.

In more detail, as shown in FIG. 5 showing partial structures of the first functional structure and the second functional structure, the partial structure shown in the first functional structure include:

a buffer layer 11, formed on a surface of the first organic substrate 10;

a drive transistor, formed on a side of the buffer layer 11 facing away from the first organic substrate 10 and including an active layer 12, a gate electrode 140, an input electrode 163, and an output electrode 162;

a capacitor structure, including a first electrode plate 141 and a second electrode plate 15; wherein the first electrode plate 141 is coupled to a power supply anode 180 of the display substrate through a fourth connection portion 161;

a set of pads, including a first pad pad2 and a second pad pad1; wherein the first pad pad2 is connected to the output electrode 162 of the drive transistor through a first connection portion 192 and a second connection portion 182, and the second pad pad1 is coupled to a power supply cathode 181 in the display substrate through a third connection portion 191; and an insulating film (e.g., marks 130, 131, 132), a first planarizing layer 170, a first passivation layer 171, a second planarizing layer 172, a second passivation layer 173, a third planarizing layer 174, a data line 160, etc., provided between the functional patterns; and some functional patterns with conductive properties (e.g., marks 160, 193).

It should be noted that each of the first pad pad2, the second pad pad1, the functional pattern 193 and the binding pin 25 may be made of indium tin oxide (ITO) or metallic copper, but they are not limited thereto.

In the display substrate provided in the above embodiment, the first signal line and the first signal line lead are used for transmitting a variety of signals. For example, the first signal line may be coupled to a data signal line in the display region of the display substrate, and the first signal line lead may be coupled to a chip for providing a data signal, and the data signal provided by the chip is transmitted to a corresponding data signal line through the first signal line lead and the first signal line. Of course, the first signal line and the first signal line lead may be provided for transmitting a positive power signal or a negative power signal, for example.

An embodiment of the present disclosure further provides a display device, including a plurality of display substrates provided in the above embodiments and spliced together.

Specifically, since the display substrate provided by the above embodiments has high reliability and production yield, and can realize narrow frames, the display device provided by the embodiments of the present disclosure, when incorporating the plurality of the display substrates sliced together, not only has the advantages of the display substrate, but also realizes a large-sized display function.

It should be noted that the display device may be any product or component having a display function, such as a TV, a display, a digital photo frame, a mobile phone, a tablet computer, or the like.

It should be noted that the embodiments in this specification are described in a progressive manner, and the embodiments can be referred to each other for the same or similar parts, and the description for each embodiment focuses on the differences thereof from the other embodiments.

Technical or scientific terms used in the present disclosure shall have ordinary meanings understood by those having ordinary skills in the art to which the present disclosure pertains, unless otherwise defined. The terms "first", "second", and the like used herein are not intended to indicate any order, quantity, or importance, but are only used to distinguish different components from each other. The term "including", "comprising", or any similar variety is intended to specify that the element or item stated before these terms encompasses the elements or items listed after these terms and equivalents thereof, but do not preclude the other elements or items. The phrases "connecting", "coupling", etc. are not limited to a physical or mechanical connection, but may also include an electrical connection, either direct or indirect. The terms "up", "down", "left", "right", etc., are merely used to indicate a relative positional relationship, and if the absolute position of the described object is changed, the relative positional relationship will be changed accordingly.

It will be understood that when an element such as a layer, a film, a region, or a substrate is mentioned to be "on" or "under" another element, it can be "directly" "on" or "under" the other element, or there may be one or more intermediate elements.

In the description of the foregoing embodiments, specific features, structures, materials, or characteristics may be combined in any suitable manner in any one or more embodiments or examples.

The above are only specific implementations of the present disclosure, but the scope of protection of the present disclosure is not limited thereto, and any person skilled in the art can easily think of changes or replacements within the technical scope disclosed in the present disclosure, which shall fall within the scope of protection of the present disclosure. Therefore, the protection scope of the present disclosure should be defined by the claims.

What is claimed is:

1. A method for manufacturing a display substrate, comprising:

fabricating a first functional structure on a first side of a common substrate and fabricating a second functional structure on a second side of the common substrate, the first side being opposite to the second side;

fabricating, in an edge region of the common substrate, a via hole which penetrates the common substrate, the first functional structure and the second functional structure; and fabricating a conductive connection portion in the via hole, a first end of the conductive connection portion on the first side extending out of the via hole and coupled to a first functional pattern in the first functional structure, and a second end of the conductive connection portion on the second side extending out of the via hole and coupled to a second functional pattern in the second functional structure; and wherein fabricating the first functional structure comprises:

fabricating, on the first side of the common substrate, a thin film transistor array layer which comprises a plurality of sub-pixel drive circuits, each including a drive transistor; and fabricating a first signal line and a set of pads for binding one or more light emitting devices on a side of the thin film transistor array layer facing away from the common substrate, wherein the first signal line is configured to be coupled to an end of the conductive connection portion on the first side; the set of pads is in one-to-one correspondence with the sub-pixel drive circuits, and the set of pads comprises a first pad coupled to an output electrode of the drive transistor in the corresponding sub-pixel drive circuit, and a second pad coupled to a cathode of a power supply in the display substrate.

2. The method according to claim 1, wherein fabricating the first functional structure on the first side of the common substrate and fabricating the second functional structure on the second side of the common substrate comprises:

coating an organic material on a first glass substrate to form a first organic substrate;

fabricating the first functional structure on a side of the first organic substrate facing away from the first glass substrate;

separating the first glass substrate from the first organic substrate;

coating an organic material on a second glass substrate to form a second organic substrate;

fabricating the second functional structure on a side of the second organic substrate facing away from the second glass substrate;

separating the second glass substrate from the second organic substrate; and bonding a surface of the first organic substrate facing away from the first functional structure to a surface of the second organic substrate facing away from the second functional structure, the first organic substrate and the second organic substrate constituting the common substrate.

3. The method according to claim 2, wherein bonding the first organic substrate to the second organic substrate comprises:

bonding the surface of the first organic substrate facing away from the first functional structure to the surface of the second organic substrate facing away from the second functional structure using a prepreg made of a resin; and curing the prepreg.

4. The method according to claim 3, wherein fabricating the via hole comprises:

irradiating a via hole region in the edge region where the via hole is to be fabricated with a laser, to burn the first functional structure, the first organic substrate, the cured prepreg, the second organic substrate and the second functional structure in the via hole region to form the via hole.

5. The method according to claim 1, wherein fabricating the second functional structure comprises:

forming a first signal line lead and an alignment mark on the second side of the common substrate;

fabricating an insulating layer covering the alignment mark and a part of the first signal line lead, wherein a part of the first signal line lead not covered by the insulating layer is configured to be coupled to an end of the conductive connection portion on the second side; and fabricating, on a side of the insulating layer facing away from the common substrate, a binding pin which is coupled to the first signal line lead through a through hole provided in the insulating layer.

6. The method according to claim 5, wherein the first signal line lead and the alignment mark are simultaneously fabricated by one single patterning process on the second side of the common substrate.

7. The method according to claim 1, further comprising:

binding one or more micro-light-emitting diodes on the set of pads after the conductive connection portion has been fabricated.

* * * * *